(12) United States Patent
Haque

(10) Patent No.: US 10,921,282 B2
(45) Date of Patent: Feb. 16, 2021

(54) FIELD-EFFECT APPARATUS, ASSOCIATED APPARATUS AND METHODS

(71) Applicant: Nokia Technologies Oy, Espoo (FI)

(72) Inventor: Samiul Haque, Cambridge (GB)

(73) Assignee: Nokia Technologies Oy, Espoo (FI)

(*) Notice: Subject to any disclaimer, the term of this patent is extended or adjusted under 35 U.S.C. 154(b) by 166 days.

(21) Appl. No.: 15/548,280

(22) PCT Filed: Jan. 28, 2016

(86) PCT No.: PCT/FI2016/050043
§ 371 (c)(1),
(2) Date: Aug. 2, 2017

(87) PCT Pub. No.: WO2016/124813
PCT Pub. Date: Aug. 11, 2016

(65) Prior Publication Data
US 2018/0024092 A1    Jan. 25, 2018

(30) Foreign Application Priority Data

Feb. 4, 2015 (EP) .................................. 15153822

(51) Int. Cl.
*G01N 27/414* (2006.01)
*H01L 29/786* (2006.01)
(Continued)

(52) U.S. Cl.
CPC ....... *G01N 27/414* (2013.01); *H01L 29/0673* (2013.01); *H01L 29/42364* (2013.01);
(Continued)

(58) Field of Classification Search
None
See application file for complete search history.

(56) References Cited

U.S. PATENT DOCUMENTS

| 8,860,137 B2 | 10/2014 | Zhou et al. |
| 2003/0089899 A1* | 5/2003 | Lieber ............ B82Y 10/00 257/9 |

(Continued)

FOREIGN PATENT DOCUMENTS

| CN | 102506693 A | 6/2012 |
| CN | 201680008545.4 | 3/2020 |

(Continued)

OTHER PUBLICATIONS

International Search Report and Written Opinion received for corresponding Patent Cooperation Treaty Application No. PCT/FI2016/050043, dated Jun. 9, 2016, 19 pages.

(Continued)

*Primary Examiner* — Eli S Mekhlin
(74) *Attorney, Agent, or Firm* — Harrington & Smith

(57) ABSTRACT

An apparatus comprising a channel member, first and second electrodes configured to enable a flow of electrical current from the first electrode through the channel member to the second electrode, and a supporting substrate configured to support the channel member and the first and second electrodes, wherein one or more of the supporting substrate and electrodes are configured such that a portion of the channel member is suspended to expose opposing surfaces of the portion, the exposed opposing surfaces comprising respective functional coatings thereon configured to facilitate variation of the flow of electrical current through the channel member.

11 Claims, 5 Drawing Sheets

(51) Int. Cl.
H01L 29/06 (2006.01)
H01L 29/49 (2006.01)
H01L 29/423 (2006.01)

(52) U.S. Cl.
CPC .... H01L 29/42384 (2013.01); H01L 29/4908 (2013.01); H01L 29/78648 (2013.01); H01L 29/78696 (2013.01)

(56) References Cited

U.S. PATENT DOCUMENTS

| | | | |
|---|---|---|---|
| 2006/0008942 A1* | 1/2006 | Romano | B82Y 10/00 438/99 |
| 2006/0286785 A1 | 12/2006 | Rogers et al. | |
| 2007/0095660 A1 | 5/2007 | Peters | 204/400 |
| 2007/0155025 A1* | 7/2007 | Zhang | B82Y 10/00 438/3 |
| 2008/0191200 A1 | 8/2008 | Frisbie et al. | |
| 2010/0051913 A1 | 3/2010 | Takeya et al. | |
| 2010/0283031 A1 | 11/2010 | Kim et al. | |
| 2012/0111599 A1 | 5/2012 | Roberson et al. | |
| 2012/0154248 A1 | 6/2012 | Hague et al. | |
| 2012/0170171 A1 | 7/2012 | Lee et al. | |
| 2013/0140531 A1 | 6/2013 | Park et al. | |
| 2013/0175676 A1 | 7/2013 | Shin et al. | |
| 2013/0204107 A1* | 8/2013 | Lee | A61B 5/14735 600/345 |
| 2013/0302940 A1 | 11/2013 | Avouris et al. | |
| 2014/0008746 A1 | 1/2014 | Ferrao De Paiva Martins et al. | |
| 2014/0191224 A1 | 7/2014 | Takeya et al. | |
| 2014/0232956 A1 | 8/2014 | Kwon et al. | |
| 2014/0239357 A1* | 8/2014 | Choong | H01L 51/0558 257/288 |
| 2014/0319466 A1 | 10/2014 | Dasgupta et al. | |
| 2015/0228859 A1* | 8/2015 | Morreale | H01L 51/5296 257/29 |

FOREIGN PATENT DOCUMENTS

| | | |
|---|---|---|
| JP | 2008082988 A | 4/2008 |
| WO | 2004/032193 A2 | 4/2004 |
| WO | 2013016601 | 1/2013 |
| WO | 2014/131043 A1 | 8/2014 |
| WO | 2014169242 | 10/2014 |

OTHER PUBLICATIONS

Choi Jeong-Seon et al. "Stretchable Organic Thin-Film Transistors Fabricated on Wavy-Dimensional Elastomer Substrates Using Stiff-Island Structures", IEEE Electron Device Letters, IEEE Service Center, new York, NY, US, vol. 35, No. 7, Jul. 1, 2014, pp. 762-764.
Sharma et al., "Graphene Based Field Effect Transistors: Efforts Made Towards Flexible Electronics", Solid-State Electronics, vol. 89, 2013, pp. 177-188.
Yomogida et al., "Ambipolar Organic Single-Crystal Transistors Based on Ion Gels", Advanced Materials, vol. 24, No. 32, Aug. 22, 2012, p. 1-6.
Moyano et al., "Graphene Electronics: From Classic to Quantum", Association of Asia Pacific Physical Societies, vol. 23, No. 4, Aug. 2013, pp. 8-13.
Tombros et al., "Large Yield Production Of High Mobility Freely Suspended Graphene Electronic Devices On A PMGI Based Organic Polymer", Mesoscale and Nanoscale Physics, vol. 109, No. 9, 2011, pp. 1-14.
Choi et al., "Use of a columnar metal thin film as a nanosieve with sub-10 nm pores", Advance materials, vol. 24, No. 32, 2012, pp. 1-6.
Jiang et al., "Quantum hall effect in graphene", Solid State Communications, vol. 143, 2007, pp. 14-19.
Levendorf et al., "Transfer-Free Batch Fabrication ofSingle Layer Graphene Transistors", Nano Letters, vol. 9, No. 12, 2009, pp. 4479-4483.
Bharadwaj et al., "Transfer free suspended graphene devices on silicon using electrodeposited copper", Journal of Vacuum Science & Technology B, Nanotechnology and Microelectronics: Materials, Processing, Measurement, and Phenomena, Jan. 17, 2014, pp. 1-8.
Guo et al., "Mono-Layer C-Face Epitaxial Graphene For High Frequency Electronics", Thesis, Aug. 2014, 146 pages.
Wu et al., "High-Frequency, Scaled Graphene Transistors On Diamond-Like Carbon", Nature, vol. 472, No. 7341, Apr. 7, 2011, pp. 74-78.
Extended European Search Report received for corresponding European Patent Application No. 15153822.0, dated Sep. 22, 2015, 16 pages.
Buitrago et al., "Electrical Characterization Of High Performance, Liquid Gated Vertically Stacked SiNW-Based 3D FET Biosensors", Sensors and Actuators B: Chemical, vol. 199, Aug. 2014, pp. 291-300.
Curreli et al., "Real-Time, Label-Free Detection of BiologicalEntities Using Nanowire-Based FETs", IEEE Transactions On Nano-technology, vol. 7, No. 6, Nov. 2008, pp. 651-667.
Cui et al., "Nanowire Nanosensors For Highly Sensitive And Selective Detection Of Biological And Chemical Species", Science, vol. 293, No. 5533, Aug. 17, 2001, pp. 1289-1292.
Extended European Search Report received for corresponding European Patent Application No. 15167192.2, dated Nov. 16, 2015, 10 pages.
Lim et al., "Development Of Suspended 2D Carbon Nanostructures: Nanowires To Nanomeshes", The 17th International Conference on Solid-State Sensors, Actuators and Microsystems Transducers & Eurosensors XXVII, Jun. 16-20, 2013, pp. 1935-1937.
Cooper et al., "Experimental Review Of Graphene", ISRN Condensed Matter Physics Mesoscale and Nanoscale Physics, Oct. 29, 2011, pp. 1-50.
Bolotin et al., "Ultrahigh Electron Mobility In Suspended Graphene", Solid State Communications, vol. 46, May 27, 2008, pp. 1-5.
Kara et al., "Fabrication And Characterization Of GNR Transmisson Lines For MMIC Applications", IEEE International RF and Microwave Conference (RFM), Dec. 9-11, 2013, pp. 42-46.

* cited by examiner

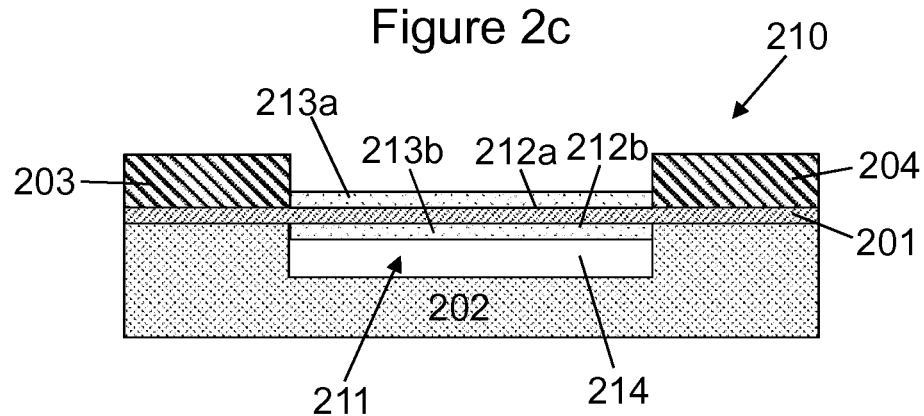
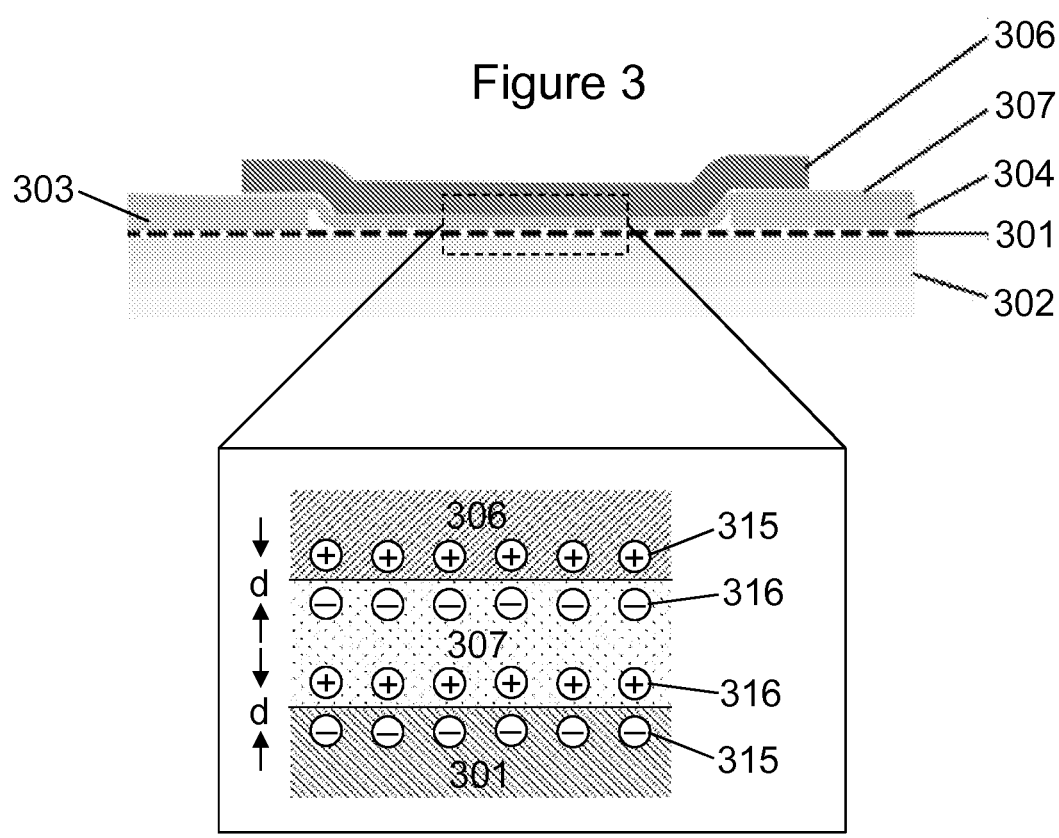

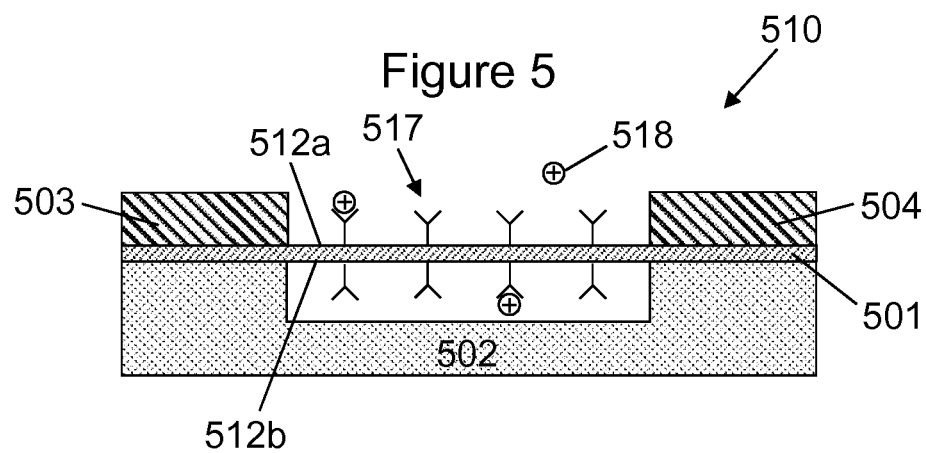
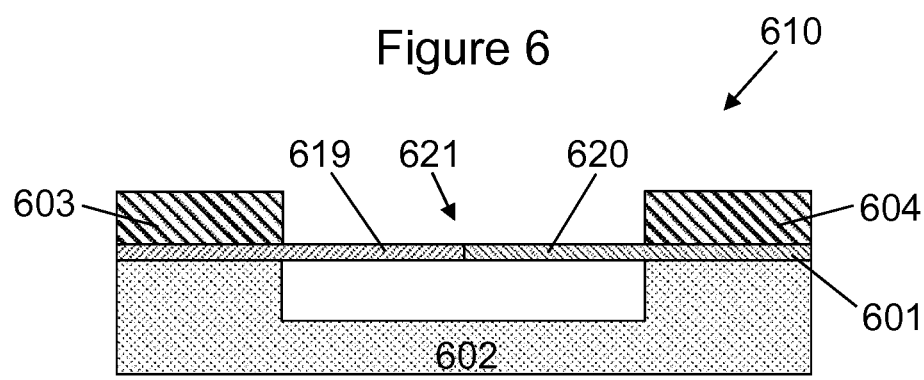
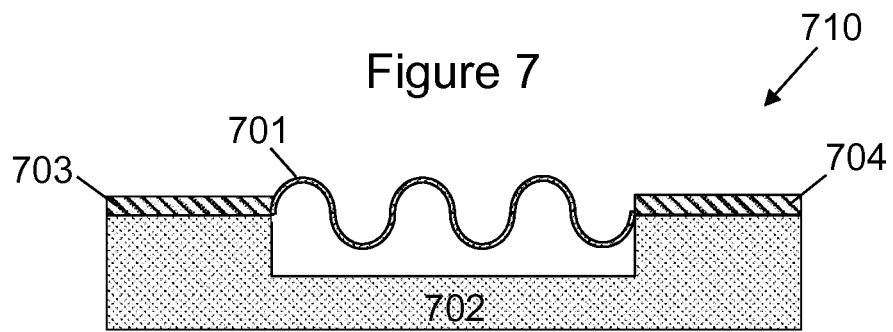

FIELD-EFFECT APPARATUS, ASSOCIATED APPARATUS AND METHODS

RELATED APPLICATION

This application was originally filed as PCT Application No. PCT/FI2016/050043 filed Jan. 28, 2016 which claims priority benefit from EP Application No. 15153822.0 filed Feb. 4, 2015.

TECHNICAL FIELD

The present disclosure relates particularly to field-effect devices, associated methods and apparatus, and specifically concerns an apparatus comprising a channel member having a portion which is suspended to expose opposing surfaces of the portion, the exposed opposing surfaces comprising respective functional coatings thereon to facilitate variation of a flow of electrical current between first and second electrodes through the channel member. Certain disclosed example aspects/embodiments relate to field-effect transistors, smart windows and portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new field-effect devices with improved physical and electrical properties for use in a variety of applications.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a channel member, first and second electrodes configured to enable a flow of electrical current from the first electrode through the channel member to the second electrode, and a supporting substrate configured to support the channel member and the first and second electrodes,
wherein one or more of the supporting substrate and electrodes are configured such that a portion of the channel member is suspended to expose opposing surfaces of the portion, the exposed opposing surfaces comprising respective functional coatings thereon configured to facilitate variation of the flow of electrical current through the channel member.

The apparatus may comprise at least one gate electrode to which a voltage can be applied to vary the electrical current through the channel member, and the functional coating on each of the exposed opposing surfaces may comprise a dielectric material configured to inhibit a flow of electrical current between the at least one gate electrode and the channel member.

The apparatus may have one of a side gate configuration in which a gate electrode is positioned laterally with respect to the channel member, a top gate configuration in which a gate electrode is positioned to overlie the channel member, a bottom gate configuration in which a gate electrode is positioned to underlie the channel member, and a top-bottom gate configuration in which one gate electrode is positioned to overlie the channel member and another gate electrode is positioned to underlie the channel member.

The dielectric material may comprise one or more of an ion gel, an ionic liquid, an electrolyte, a solid electrolyte, a polymer electrolyte and a gel electrolyte.

The functional coating on each of the exposed opposing surfaces may comprise a receptor species configured to interact with an analyte species in the surrounding environment, interaction of the receptor species with the analyte species causing a variation in the electrical current through the channel member.

The analyte species may be electrically charged, and interaction of the receptor species with the analyte species may position the analyte species in sufficient proximity to the channel member that the charge on the analyte species causes the variation in electrical current.

The functional coating on each of the exposed opposing surfaces may comprise one or more dopants configured to cause a variation in the electrical current through the channel member.

The one or more dopants may be configured to form at least one of a p-type region, an n-type region, a pn-junction, a pnp-junction and an npn-junction in the channel member.

The functional coating on one of the exposed opposing surfaces may be the same or different to the functional coating on the other of the exposed opposing surfaces.

One or more of the supporting substrate, electrodes, channel member and functional coatings may be configured to be substantially reversibly deformable.

The channel member may have a wave-like structure configured to facilitate deformation of the apparatus.

The wave-like structure may be one or more of a corrugated, serpentine, sinusoidal, sawtooth and square wave structure or a mesh corrugated structure of the above.

More than 50% of the combined surface area of the exposed opposing surfaces may comprise a functional coating thereon.

The first and second electrodes may be positioned between the channel member and the supporting substrate.

The apparatus geometry could be such that the suspended structure could be suspended on more than two electrodes on the same plane to form e.g. hall bar structures, and four electrodes to form van der pauw measurements.

The channel member may be positioned between the supporting substrate and the first and second electrodes.

The channel member may comprise one or more nanowires, nanotubes or nanoribbons.

The channel member may comprise one or more of a metal and a semiconductor.

The channel member may comprise one or more of carbon, graphene or graphene related materials, silicon, germanium, gallium arsenide, silicon carbide, gold, silver and copper.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a field-effect transistor, a memristor, hall bar structure, a structure to form van der pauw measurement, a photodetector, a phototransistor, a photodiode, a photovoltaic cell and a module for one or more of the same.

According to a further aspect, there is provided a method of forming an apparatus,
the apparatus comprising a channel member, first and second electrodes configured to enable a flow of electrical current from the first electrode through the channel member to the second electrode, and a supporting substrate configured to support the channel member and the first and second electrodes, one or more of the supporting substrate and electrodes configured such that a portion of the channel member is suspended to expose opposing surfaces of the portion,
the method comprising depositing respective functional coatings onto the exposed opposing surfaces of the suspended portion, the respective functional coatings configured to facilitate variation of the flow of electrical current through the channel member.

The method may comprise depositing the channel member and first and second electrodes onto the supporting substrate, and deposition of the respective functional coatings may be performed before or after deposition of the channel member and first and second electrodes.

The respective functional coatings may be deposited using a non-directional deposition technique.

The respective functional coatings may be deposited by one or more of printing, spraying and dropcasting or ambient exposure to functional analytes.

The steps of any method disclosed herein do not have to be performed in the exact order disclosed, unless explicitly stated or understood by the skilled person.

Throughout the present specification, descriptors relating to relative orientation and position, such as "top", "bottom", "upper", "lower", "above" and "below", as well as any adjective and adverb derivatives thereof, are used in the sense of the orientation of the apparatus as presented in the drawings. However, such descriptors are not intended to be in any way limiting to an intended use of the described or claimed invention.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:

FIG. 2c shows another example of an apparatus described herein (cross-section);

FIG. 3 shows a field-effect transistor comprising an ion gel gate dielectric (cross-section);

FIG. 5 shows one example of an apparatus described herein comprising a receptor species on the exposed opposing surfaces of the channel member (cross-section);

FIG. 6 shows one example of an apparatus described herein comprising a pn-junction in the channel member (cross-section);

FIG. 7 shows one example of an apparatus described herein comprising a channel member having a wave-like structure (cross-section);

DESCRIPTION OF SPECIFIC ASPECTS/EMBODIMENTS

One or more disclosed embodiments of the present apparatus relate to field-effect transistors. A field-effect transistor is a type of transistor in which an electrical current is carried along a conduction channel, the conductance (or conductivity) of which can be controlled by a transverse electric field.

Figure 1:
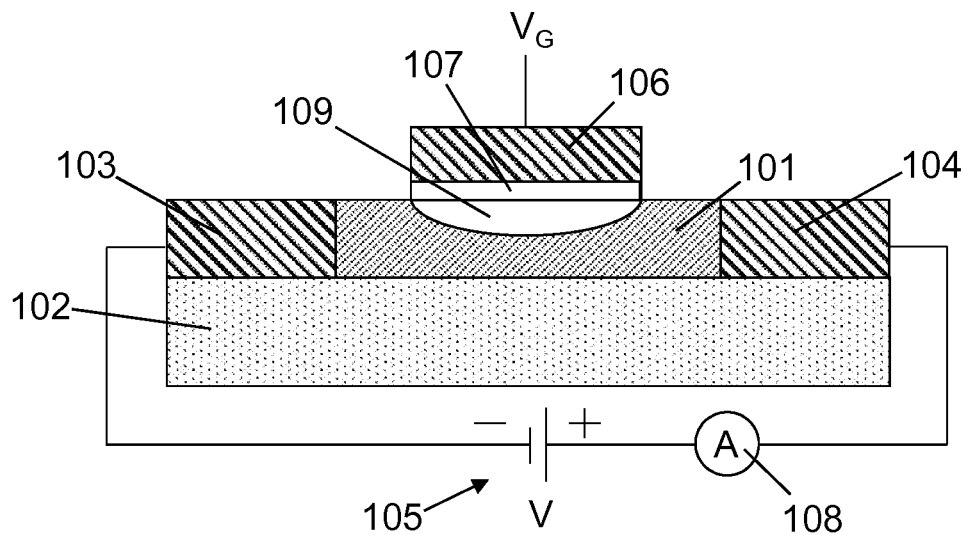
FIG. 1 shows a conventional field-effect transistor (cross-section)

FIG. 1 shows a conventional field-effect transistor in cross-section. As shown in this figure, a metal or semiconductor channel 101 (such as p-type silicon) is supported on a substrate 102 and connected to metal source 103 and drain 104 electrodes. A current is injected and collected via the source 103 and drain 104 electrodes, respectively, by applying a potential difference (V) 105 across the channel 101. The conductance of the channel 101 between the source 103 and drain 104 electrodes is switched on and off by a third electrode (the gate electrode 106) capacitively coupled through a thin dielectric layer 107. The conductance may be determined by measuring the current through the channel 101 (using an ammeter 108, for example) and dividing by the potential difference (V) 105. With p-type silicon (or another p-type semiconductor), application of a positive gate voltage ($V_G$) depletes the charge carriers (creating a depletion region 109 in the channel 101) and reduces the conductance, whilst applying a negative gate voltage ($V_G$) leads to an accumulation of charge carriers (creating a conductive region) and an increase in conductance.

Two factors which affect the performance of field-effect transistors are the mobility of the charge carriers through the channel, and the ratio of the conductance in the on state to the conductance in the off state (the so-called "on/off ratio"). It has been found, however, that the mobility of the charge carriers can be adversely affected by charge carrier scattering and trapping as a result of interactions with the underlying substrate. In addition, due to the positioning of the gate electrode on top of the channel, the electric field generated by the gate voltage typically has less of an influence on the charge carriers near the lower surface of the channel than those near the upper surface of the channel (hence the formation of the depletion/conduction region at the upper surface only in FIG. 1).

There will now be described an apparatus and associated methods that may or may not provide a solution to one or more of these issues.

Figure 2A:
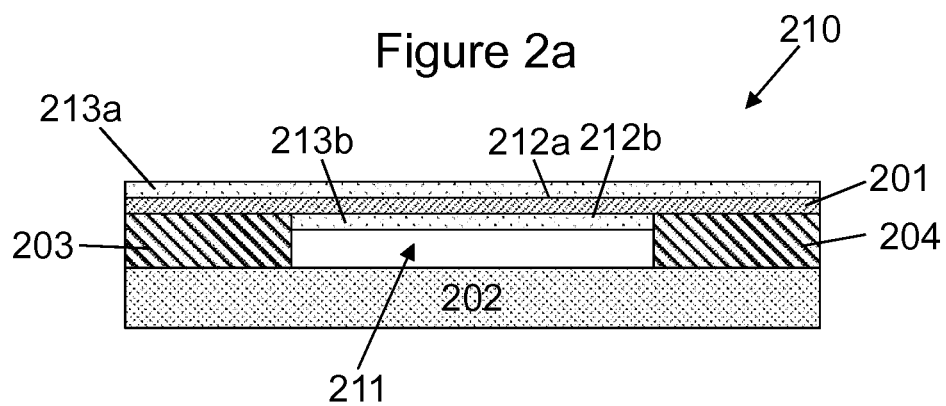
FIG. 2a shows one example of an apparatus described herein (cross-section)

FIG. 2a illustrates one example of the present apparatus 210 in cross-section. The apparatus 210 comprises a channel member 201, first 203 and second 204 electrodes configured to enable a flow of electrical current from the first electrode 203 through the channel member 201 to the second electrode 204, and a supporting substrate 202 configured to support the channel member 201 and the first 203 and second 204 electrodes. Unlike the conventional field-effect transistor structure shown in FIG. 1, one or more of the supporting substrate 202 and electrodes 203, 204 of the present apparatus 210 are configured such that a portion 211 of the channel member 201 is suspended to expose opposing surfaces 212a,b of the portion 211. The "opposing surfaces" in this case may be taken to mean the upper 212a and lower 212b surfaces of the channel member 201.

By suspending a portion 211 of the channel member 201 to expose the opposing surfaces 212a,b, the lower surface 212b of the portion 211 is distanced from the substrate 202. This helps to reduce the substrate effects on the charge carriers in the channel member 201 and thereby increase their mobility. Suspension of the channel member portion 211 also allows the lower surface 212b of the portion 211 to be coated with a functional material 213b (before or after deposition of the channel member 201 and electrodes 203, 204 on the substrate 202) configured to facilitate variation of the flow of electrical current through the channel member 201. For example, in the case of a field-effect transistor, the functional coating 213a,b may comprise a dielectric material configured to inhibit a flow of electrical current between a bottom gate electrode (not shown) and the channel member 201. In this way, the bottom gate electrode could be used to influence the charge carriers near the lower surface 212b of the channel 201 thus providing for a greater on/off ratio when used in combination with a top gate electrode.

In the example shown in FIG. 2a, the exposed opposing surfaces 212a,b each comprise a respective functional coating 213a,b thereon. In practice, the functional coating 213a on one of the exposed surfaces 212a may be the same or different to the functional coating 213b on the other of the exposed opposing surfaces 212b. Furthermore, whilst 100% of the exposed surface area is coated in this example, this is not absolutely necessary for each application. For instance, if the functional coating 213a,b comprises a conventional dielectric material for use with a gate electrode, it need only cover the footprint of the gate electrode to prevent physical contact between the channel 201 and gate. In general, however, since the functional coatings 213a,b can be applied to both of the exposed opposing surfaces 212a,b, over 50% of the exposed surface area would typically be coated.

In the example of FIG. 2a, the first 203 and second 204 electrodes are positioned between the channel member 201 and the supporting substrate 202. This configuration may be achieved simply by depositing the electrodes 203, 204 on top of the supporting substrate 202, and depositing the channel member 201 on top of the deposited electrodes 203, 204 such that a portion 211 of the channel member 201 is suspended. The functional coatings 213a,b can then be deposited onto the exposed opposing surfaces 212a,b of the suspended portion 211 (as shown).

Figure 2B:
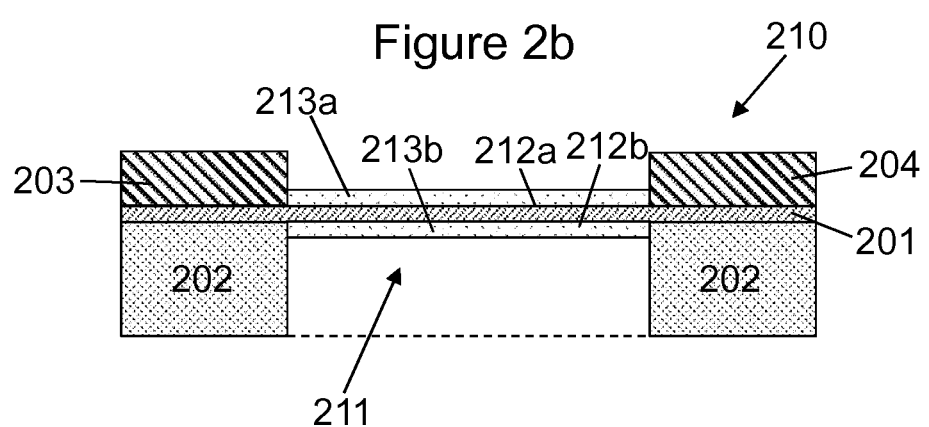
FIG. 2b shows another example of an apparatus described herein (cross-section)

FIG. 2b shows another example of the present apparatus 210 in cross-section. In this example, the channel member 201 is positioned between the supporting substrate 202 and the first 203 and second 204 electrodes. This configuration may be achieved by depositing the channel member 201 on top of the supporting substrate 202 followed by deposition of the first 203 and second 204 electrodes onto the deposited channel member 201. The supporting substrate 202 can then be back-etched as shown to expose the lower surface 212b of the channel member 201 before deposition of the functional coatings 213a,b onto the exposed opposing surfaces 212a,b.

FIG. 2c shows another example of the present apparatus 210 (in cross-section) in which the channel member 201 is positioned between the supporting substrate 202 and the first 203 and second 204 electrodes. In this example, the substrate 202 has been front-etched to form a trench 214. The channel member and electrodes can then be deposited sequentially on top of the substrate 202 as described with reference to FIG. 2b. Due to the formation of the trench 214 on the upper surface of the substrate 202, a portion 211 of the channel member 201 is suspended to allow deposition of a respective functional coating 213b on the lower surface 212b thereof (along with deposition of a functional coating 213a on the upper surface 212a of the channel member portion 211).

One or more standard lithographic techniques may be used to limit deposition and/or etching to specific regions of the respective materials in the fabrication processes described above. Furthermore, a number of different techniques may be used to deposit the functional coatings 213a,b onto the exposed opposing surfaces 212a,b of the channel member 201. The specific technique used will depend on whether the deposition takes place before (pre-deposition) or after (post-deposition) deposition of the channel member 201 onto the substrate 202. Almost any technique which is compatible with the chosen materials can be used for pre-deposition due to the fewer physical constraints. With post-deposition, on the other hand, the choice of techniques is limited by the types of materials used for the channel member 201 and functional coatings 213a,b.

When a porous material is used to form the channel member 201 and the functional coatings 213a,b on the upper 212a and lower 212b surfaces of the channel member 201 comprise a fluidic material, the functional coatings 213a,b may be deposited using a top-down technique (such as printing, spraying or dropcasting). This is because some of the functional coating 213a on the upper surface 212a of the channel member 201 will permeate from the upper surface 212a to the lower surface 212b through the channel member 201 to form the functional coating 213b on the lower surface 212b. The use of a fluidic material also allows the coatings 213a,b to be deposited onto the exposed surfaces 212a,b by passing the fluid over the upper 212a and lower 212b surfaces, or by immersing the apparatus 210 in the fluid. In cases where the functional coatings 213a,b do not comprise a fluidic material, a non-directional (or omnidirectional) technique such as chemical vapour deposition or atomic layer deposition may be used.

As mentioned above, the positioning of the gate electrode on top of the channel can limit control of the channel conductance which can reduce the on/off ratio of a field-effect transistor. This can be addressed by exposing both the upper and lower surfaces of the channel to electric fields, as described previously. Furthermore, the capacitance decreases as the thickness of the dielectric material used to separate the gate electrode from the channel increases. As a result, existing field-effect transistors use ultrathin layers of dielectric material which are susceptible to defects and require complex fabrication.

One way of avoiding the need for thin dielectric layers and multiple gate electrodes is to replace the conventional dielectric with an ion gel. Ion gels consisting of low molar mass cations and anions may be used as high-capacitance gate dielectrics 107 in field-effect transistors. The primary figure of merit for a gate dielectric 107 is the specific capacitance, as the charge induced in the transistor channel 101 is directly proportional to capacitance ($Q=C \times (V_G - V_T)$, where Q is the electric charge, C is the capacitance, $V_G$ is the applied gate voltage, and $V_T$ is the threshold voltage). An advantage of using ion gel dielectrics compared to solid state dielectrics is a significantly enhanced charge modulation for the same gate voltage.

FIG. 3 shows a field-effect transistor in cross-section comprising an ion gel gate dielectric 307. As illustrated in this figure, the enhanced charge modulation in the channel 301 is due to an electric double-layer that is produced at the interface of the metal or semiconductor 301 with the ion gel 307. An electric double-layer is a structure that forms at the surface of a charged object when it is in contact with a fluid. The charges 315 on the surface of the object at the object-fluid interface attract oppositely charged ions 316 in the fluid towards the surface charge 315. The ions 316 then arrange themselves at the interface to mirror the surface charge 315 and form an insulating structure. In an electric double-layer (i.e. a layer of surface charge 315 and a layer of ions 316), the separation "d" of the surface charge 315 and ions 316 is on the order of nanometres. This small separation results in a large capacitance at the object-fluid interface, a feature which is exploited in supercapacitors.

By using ionically conducting but electrically insulating ion gels 307 as gate dielectrics, the number of charge carriers in a transistor channel 301 can be tuned beyond $10^{14}$ cm$^{-2}$. Accessing such large carrier densities by ion gel gating is useful for examining transport behaviour and critical phenomena (e.g. the insulator-to-metal transition) in semiconductors. The compensating disadvantage is a slower relaxation time.

Figure 4A:
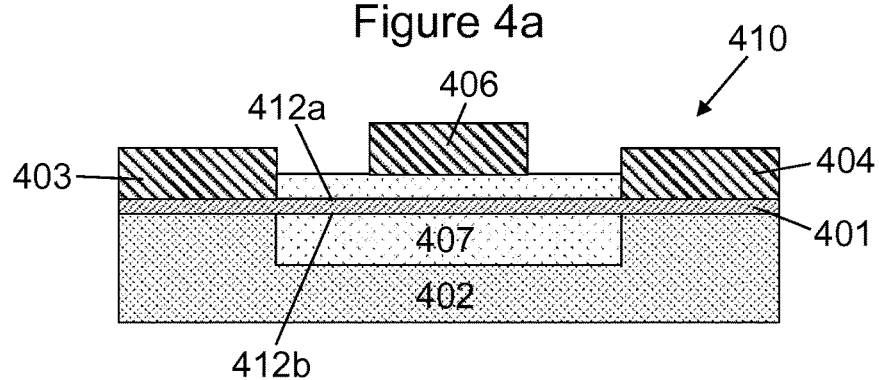
FIG. 4a shows one example of an apparatus described herein comprising a top gate configuration (cross-section)

FIG. 4a shows one example of the present apparatus 410 (in cross-section) configured for use as a field-effect transistor. As in the previous examples, the apparatus 410 comprises a channel member 401 and first 403 (source) and second 404 (drain) electrodes on top of a supporting substrate 402, the electrodes 403, 404 and supporting substrate 402 configured such that a portion 411 of the channel member 401 is suspended to expose opposing surfaces 412a,b of the portion 411. In this example, however, the upper 412a and lower 412b surfaces of the channel member 401 are coated with an ion gel 407, and the apparatus 410 comprises a gate electrode 406 positioned to overlie the channel member 401 (i.e. a top gate configuration). When a voltage is applied to the gate electrode 406, electric double-layers are produced at each of the channel-gel interfaces. In this way, a single gate electrode 406 is able to influence charge carriers at both the upper 412a and lower 412b surfaces of the channel member 401 resulting in greater control of the channel conductance. Furthermore, since the capacitance is dependent upon the separation of the surface charge and ions rather than the spacing of the gate electrode 406 and channel member 401 (i.e. the thickness of the conventional dielectric), the apparatus 410 is not limited to the use of ultrathin coatings. As a result, it is possible to use ion gel layers 407 of any thickness, which simplifies the fabrication process.

Figure 4B:
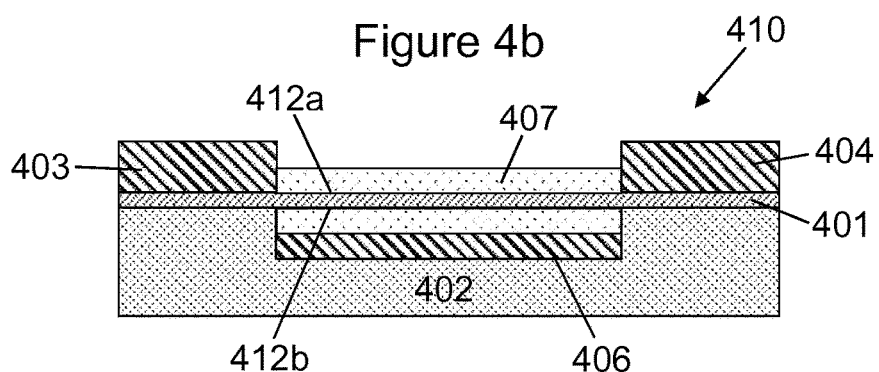
FIG. 4b shows one example of an apparatus described herein comprising a bottom gate configuration (cross-section)

FIG. 4b shows another example of the present apparatus 410 (in cross-section) configured for use as a field-effect transistor. This example is similar to that shown in FIG. 4a, except that it uses a bottom gate configuration in which the gate electrode 406 is positioned to underlie the channel member 401. The gate electrode 406 would typically be deposited onto the supporting substrate 402 before the deposition of the ion gel 407, e.g. at the same time as the first 403 and second 404 electrodes.

Figure 4C:
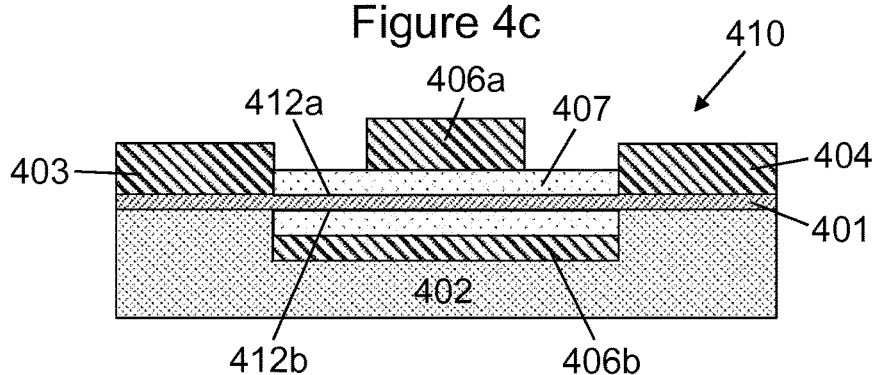
FIG. 4c shows one example of an apparatus described herein comprising a top-bottom gate configuration (cross-section)

FIG. 4c shows yet another example of the present apparatus 410 (in cross-section) configured for use as a field-effect transistor. This time the apparatus 410 has a top-bottom gate configuration in which one gate electrode 406a is positioned to overlie the channel member 401 and another gate electrode 406b is positioned to underlie the channel member 401. Whilst the use of multiple gate electrodes 406a,b is not absolutely necessary with an ion gel dielectric 407, it can advantageously increase the surface charge and capacitance.

Figure 4D:
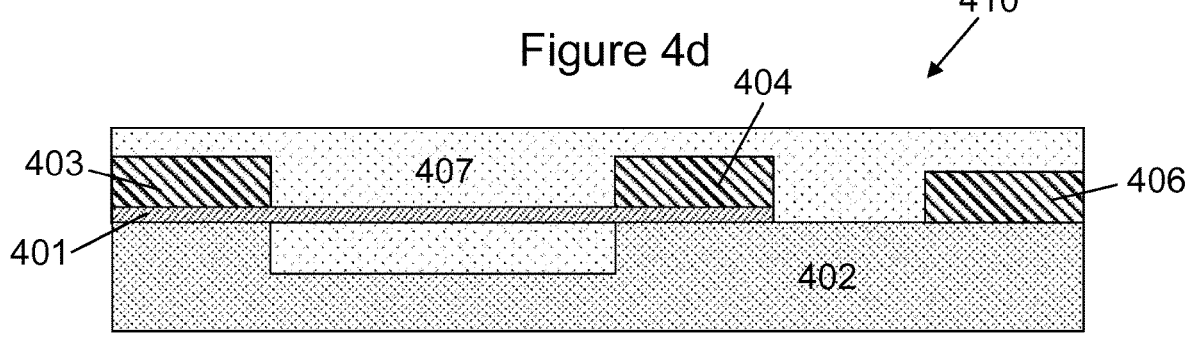
FIG. 4d shows one example of an apparatus described herein comprising a side gate configuration (cross-section)

FIG. 4d shows a further example of the present apparatus 410 (in cross-section) configured for use as a field-effect transistor. In this example, the apparatus 410 has a side gate configuration in which the gate electrode 406 is positioned laterally with respect to the channel member 401. This arrangement is achievable with an ion gel 407 because the electric double-layers are produced at the channel-gel interfaces regardless of the relative positions of the channel member 401 and the gate electrode 406. The ion gel 407 therefore ensures efficient coupling even if the gate electrode 406 is not in proximity to the upper 412a or lower 412b surface of the channel member 401.

In the examples shown in FIGS. 4a-4d, the gate dielectric 407 is not limited solely to ion gels. Any ionic fluid would work provided that it can be contained during fabrication and use of the apparatus 410. For example, the gate dielectric 407 may comprise one or more of an ion gel, an ionic liquid, an electrolyte, a solid electrolyte, a polymer electrolyte and a gel electrolyte.

Such materials may also allow the apparatus 410 to function as a memristor. Memristors (a concatenation of "memory resistors") are a fourth class of electrical component that exhibit their unique properties primarily at the nanoscale. Theoretically, memristors are a type of passive circuit element that maintain a relationship between the time integrals of current and voltage across a two terminal element. Thus, a memristor's resistance varies according to its memristive function. This allows access to a "history" of applied voltage via tiny read charges. The material implementation of memristive effects can be determined in part by the presence of hysteresis. In the present apparatus, the ion gel 407 (or other ionic fluid) may be used to control the hysteresis of the channel member 401 via interactions with the ions in solution.

The present disclosure encompasses an array of respective apparatus, each with their respective first and second electrodes and suspended channel member portions which are functionalized on opposing surfaces. These channel members may each be functionalized in the same way, or have different functionalizations applied thereto. They may each be spaced apart so that each of the apparatus of the array work independently of one another. They may, however, be spaced apart in sufficient proximity (of one or more of the first and second electrodes and the suspended channel member portion) such they are not independent of one another but operate dependent upon an adjacent proximal apparatus. For example, one apparatus may act as a reference for an adjacent apparatus by virtue of the proximity of the channel member to the channel member of the adjacent apparatus.

FIG. 5 shows another example of the present apparatus 510 (in cross-section), this time configured for use as an analyte sensor. In this example, the functional coating on each of the exposed opposing surfaces 512*a,b* comprises a receptor species 517 configured to interact with an analyte species 518 in the surrounding environment, interaction of the receptor species 517 with the analyte species 518 causing a variation in the electrical current through the channel member 501. In this way, detection of the variation in electrical current provides an indication of the presence and/or amount of analyte species 518 in the surrounding environment. The analyte sensor can be a selective sensor of at least one of several analytes and as top and bottom surfaces are exposed it can allow two separate functionalistion of the respective surfaces for detecting at least two different types of analytes (top surface for one analyte and bottom surface for different analyte, or even top/bottom surface for multiple analytes, for example). Hence suspended structures provide more surface area and also the possibility to detect various analytes in one single device architecture without reference implementation.

The receptor species 517 may be any chemical or biological species which is capable of binding to the analyte species 518. For example, it could be an antibody which is configured to bind to an antigen (analyte species 518). In some cases, the antibody 517 may bind specifically to one particular antigen 518. This is advantageous because it helps to reduce the chances of a false positive when the antibody 517 binds to a species other than the target analyte 518. The apparatus 510 could also be used as a gas sensor to detect gaseous analyte species 518, such as $O_2$, CO, $CO_2$, $NH_3$, $N_2$ or $NO_2$.

In the example shown in FIG. 5, the analyte species 518 is electrically charged, and its interaction with the receptor species 517 positions the analyte species 518 in sufficient proximity to the channel member 501 that the charge on the analyte species 518 causes the variation in electrical current. In this example, therefore, the analyte species 518 plays a similar role to the gate electrode 406 in the previous examples, but other detection mechanisms are also possible.

FIG. 6 shows another example of the present apparatus 610 in cross-section. In this example, the functional coating (not shown) on each of the exposed opposing surfaces comprises one or more dopants configured to cause a variation in the electrical current through the channel member 601. The dopants may be configured to form one or more of a p-type region, an n-type region, a pn-junction, a pnp-junction and an npn-junction in the channel member 601. By creating various p-type and n-type regions in the channel member 601, the apparatus 610 may be used as a diode, transistor, photovoltaic cell or light-emitting diode.

In the example shown in FIG. 6, the dopants have created a p-type region 619 in the left-hand side of the channel 601 and an n-type region 620 in the right-hand side of the channel 601 to form a pn-junction 621. If the first 603 and second 604 electrodes are then configured to forward-bias the pn-junction, the apparatus 610 may be used as a diode. The first 603 and second 604 electrodes could also be configured to reverse-bias the pn-junction to increase the resistance of the channel member 601, if need be.

Many new applications require electronic devices to be reversibly deformable. Examples include stretchable adhesive bandages incorporating next-to-the-skin sensors, stretchable displays in which the display elements are supported on floating rigid islands, and flexible devices configured to undergo large out-of-plane strain such as foldable or rollable e-readers and tablets. Reversibly deformable electronics may be considered as a composition of electronic materials and components formed across a substrate in a manner which allows the overall substrate to repeatedly deform (typically >>5%) without electrical failure. These materials/components should not exceed their elastic limit for repeated deformation.

In view of the above, one or more of the supporting substrate, electrodes, channel member and functional coatings of the present apparatus may be configured to be substantially reversibly deformable (e.g. reversibly flexible, stretchable and/or compressible). A range of different materials could be used to allow reversible deformation. For example, the channel member may comprise one or more nanoparticles, nanowires, nanotubes or nanoribbons, which may be formed from a metal (e.g. one or more of gold, silver and copper) or semiconductor (e.g. one or more of carbon, graphene, silicon, germanium, gallium arsenide and silicon carbide). Electrically conductive polymers or elastomers may also be used to form the channel member. The electrodes may be formed from a metal (e.g. one or more of gold, silver and copper), carbon, graphene, or indium tin oxide, and the supporting substrate may comprise one or more of a polymeric material, an elastomeric material, polyurethane, polyimide, polyethylene terephthalate, polydimethylsiloxane and polyethylene napthalate. As mentioned previously, the functional coatings may comprise a fluidic material such as an ion gel or polymer electrolyte. Such materials are typically more resilient than conventional dielectrics.

FIG. 7 shows another example of the present apparatus 710 (in cross-section) which is configured to facilitate reversible deformation. As can be seen, the channel member 701 has a wave-like structure to accommodate at least one of bending, tensile and compressive strain. This configuration allows more rigid materials to be used to form the channel member 701 whilst still enabling some degree of bending, stretching and/or compression. The wave-like structure may be one or more of a corrugated, serpentine, sinusoidal, sawtooth and square wave structure, but any waveform could be adopted in principle.

Figure 8:
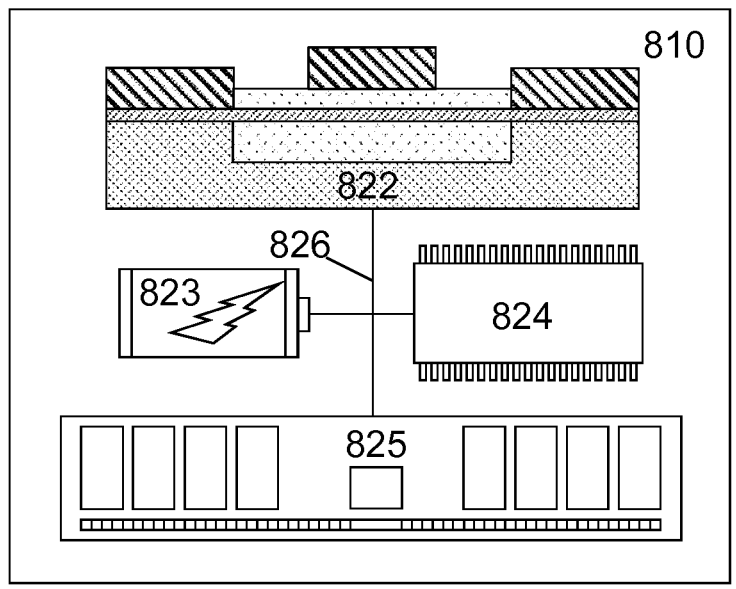
FIG. 8 shows another example of an apparatus described herein (schematic)

FIG. 8 illustrates schematically another example of the present apparatus 810. The apparatus 810 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, and a module for one or more of the same. In the example shown, the apparatus 810 comprises a field-effect transistor 822 (as described with reference to FIGS. 4a-4d), a power source 823, a processor 824 and a storage medium 825, which are electrically connected to one another by a data bus 826.

The processor 824 is configured for general operation of the apparatus 810 by providing signalling to, and receiving signalling from, the other components to manage their operation. The storage medium 825 is configured to store computer code configured to perform, control or enable operation of the apparatus 810. The storage medium 825 may also be configured to store settings for the other components. The processor 824 may access the storage medium 825 to retrieve the component settings in order to manage the operation of the other components.

Under the control of the processor 824, the power source 823 is configured to apply a voltage between the first and second electrodes to enable a flow of electrical current from the first electrode through the channel member to the second electrode, and apply a gate voltage to the gate electrode to cause a detectable change in the flow of electrical current. In this way, the field-effect transistor 822 may act as an electronic switch within the circuitry of the apparatus 810.

The processor 824 may be a microprocessor, including an Application Specific Integrated Circuit (ASIC). The storage medium 825 may be a temporary storage medium such as a volatile random access memory. On the other hand, the storage medium 825 may be a permanent storage medium 825 such as a hard disk drive, a flash memory, or a non-volatile random access memory. The power source 823 may comprise one or more of a primary battery, a secondary battery, a capacitor, a supercapacitor and a battery-capacitor hybrid.

Figure 9:
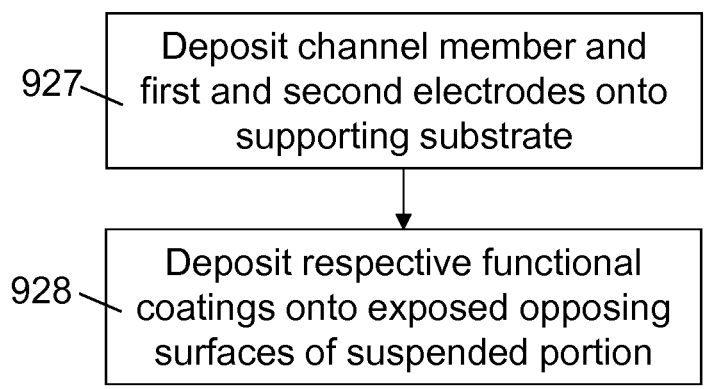
FIG. 9 shows the main steps of a method of forming an apparatus described herein.

The main steps 927-928 of a method of making an apparatus described herein are shown schematically in FIG. 9. The method generally comprises: depositing the channel member and first and second electrodes onto the supporting substrate 927; and depositing the respective functional coatings onto the exposed opposing surfaces of the suspended portion of the channel member 928.

Figure 10:
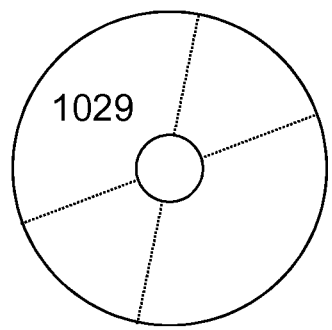
FIG. 10 shows a computer-readable medium comprising a computer program configured to perform, control or enable a method described herein.

FIG. 10 illustrates schematically a computer/processor readable medium 1029 providing a computer program according to one embodiment. The computer program may comprise computer code configured to perform, control or enable one or more of the method steps 927-928 of FIG. 9. Additionally or alternatively, the computer program may comprise computer code configured to apply a voltage between the first and second electrodes to enable a flow of electrical current from the first electrode through the channel member to the second electrode; and apply a gate voltage to the gate electrode to cause a detectable change in the flow of electrical current.

In this example, the computer/processor readable medium 1029 is a disc such as a digital versatile disc (DVD) or a compact disc (CD). In other embodiments, the computer/processor readable medium 1029 may be any medium that has been programmed in such a way as to carry out an inventive function. The computer/processor readable medium 1029 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus, comprising:
   a channel member,
   first and second electrodes configured to enable a flow of electrical current from the first electrode through the channel member to the second electrode, and
   a supporting substrate configured to support the channel member and the first and second electrodes,
   a first functional coating fixed on a first exposed surface of the channel member and not in contact with the first and second electrodes, and
   a second functional coating fixed on an opposing second exposed surface of the channel member, the second functional coating being located separate from the first functional coating and different from the first functional coating and extending uninterrupted from the first electrode to the second electrode,
   wherein one or more of the supporting substrate and electrodes are configured such that a portion of the channel member is suspended to expose the first functional coating and the second functional coating, the first functional coating and the second functional coating being configured to facilitate variation of the flow of electrical current through the channel member.

2. The apparatus of claim 1, further comprising at least one gate electrode to which a voltage can be applied to vary the electrical current through the channel member, wherein the first functional coating and the second functional coating each comprise a dielectric material configured to inhibit a flow of electrical current between the at least one gate electrode and the channel member.

3. The apparatus of claim 2, further comprising one of: a side gate configuration in which a gate electrode is positioned laterally with respect to the channel member, a top gate configuration in which a gate electrode is positioned to overlie the channel member, a bottom gate configuration in which a gate electrode is positioned to underlie the channel member, and a top-bottom gate configuration in which one gate electrode is positioned to overlie the channel member and another gate electrode is positioned to underlie the channel member.

4. The apparatus of claim 2, wherein the dielectric material comprises one or more of an ion gel, an ionic liquid, an electrolyte, a solid electrolyte, a polymer electrolyte and a gel electrolyte.

5. The apparatus of claim 1, wherein the first functional coating and the second functional coating each comprise a receptor species configured to interact with an analyte species in the surrounding environment, interaction of the receptor species with the analyte species causing a variation in the electrical current through the channel member.

6. The apparatus of claim 5, wherein the analyte species is electrically charged, and wherein interaction of the receptor species with the analyte species positions the analyte species in sufficient proximity to the channel member that the charge on the analyte species causes the variation in electrical current.

7. The apparatus of claim 1, wherein the first functional coating and the second functional coating each comprise one or more dopants configured to cause a variation in the electrical current through the channel member.

8. The apparatus of claim 7, wherein the one or more dopants are configured to form at least one of a p-type region, an n-type region, a pn-junction, a pnp-junction and an npn-junction in the channel member.

9. The apparatus of claim 1, wherein one or more of the supporting substrate, electrodes, channel member and functional coatings are configured to be substantially reversibly deformable.

10. The apparatus of claim 1, wherein the channel member has a wave-like structure configured to facilitate deformation of the apparatus.

11. The apparatus of claim 1, wherein more than 50% of the combined surface area of the exposed opposing surfaces comprises the first functional coating and the second functional coating thereon.

* * * * *